United States Patent
Fan et al.

(10) Patent No.: US 9,269,639 B2
(45) Date of Patent: Feb. 23, 2016

(54) METHOD OF DETECTING AND MEASURING CONTACT ALIGNMENT SHIFT RELATIVE TO GATE STRUCTURES IN A SEMICONDCUTOR DEVICE

(71) Applicant: Shanghai Huali Microelectronics Corporation, Shanghai (CN)

(72) Inventors: Rongwei Fan, Shanghai (CN); Feijue Liu, Shanghai (CN); Yin Long, Shanghai (CN); Qiliang Ni, Shanghai (CN); Hunglin Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 14/040,730

(22) Filed: Sep. 30, 2013

(65) Prior Publication Data

US 2014/0377888 A1    Dec. 25, 2014

(30) Foreign Application Priority Data

Jun. 25, 2013    (CN) .......................... 2013 1 0256841

(51) Int. Cl.
*H01L 21/00* (2006.01)
*H01L 21/66* (2006.01)

(52) U.S. Cl.
CPC ..................................... *H01L 22/12* (2013.01)

(58) Field of Classification Search
CPC ........... H01J 2237/24592; H01L 21/34; H01L 22/30; H01L 22/32; H01L 22/14
USPC ..................................................... 438/587, 16
See application file for complete search history.

(56) References Cited

U.S. PATENT DOCUMENTS

| 6,855,568 | B2 * | 2/2005 | Weiner et al. .................. 438/17 |
| 7,967,995 | B2 * | 6/2011 | Funk et al. ....................... 216/59 |
| 2011/0268363 | A1 * | 11/2011 | Osaki et al. ................... 382/209 |
| 2012/0257041 | A1 * | 10/2012 | Nakagaki et al. ............... 348/80 |

* cited by examiner

*Primary Examiner* — Caridad Everhart (57) ABSTRACT

The present invention provides a method of detecting and measuring the alignment shift of the contacts relative to the gate structures. The method comprises: designing a test model array having different test model regions on the substrate; forming second conductivity type doped well regions, gate structures, and first conductivity type doped active regions in each of the test model regions; forming contacts in each of the test model region; scanning the test model array by an electron-beam inspector to obtain light-dark patterns of the contacts; and detecting and measuring the alignment shift of the contacts relative to the gate structures according to the light-dark patterns of the contacts and the critical dimensions of the transistors in the test model regions.

11 Claims, 9 Drawing Sheets

Fig.1

--Prior Art--

Fig. 2

--Prior Art--

METHOD OF DETECTING AND MEASURING CONTACT ALIGNMENT SHIFT RELATIVE TO GATE STRUCTURES IN A SEMICONDCUTOR DEVICE

CROSS-REFERENCE TO RELATED APPLICATION

This application claims the priority benefit of China application serial no. 201310256841.4, filed Jun. 25, 2013. All disclosure of the China application is incorporated herein by reference.

FIELD OF THE INVENTION

The present invention relates to the field of semiconductor fabrication technology and particularly to a method of detecting and measuring the contact alignment shift relative to the gate structures in a semiconductor device.

BACKGROUND OF THE INVENTION

With the development of the IC technology and the continuous scaling down of the critical dimension, new materials and processes are introduced in the IC manufacturing process to satisfy the overall functionality of the IC products. Therefore, alignment accuracy between different structures in a semiconductor device has become more important. As the critical dimension has reduced below 65 nm, tiny alignment shifts between the contacts and the gate structures, for example due to mask misalignment, may cause the contacts short the gate structures to the substrate and lead to electric leakages, and may further result in performance degradation or even failure in the semiconductor device.

Figure 1:
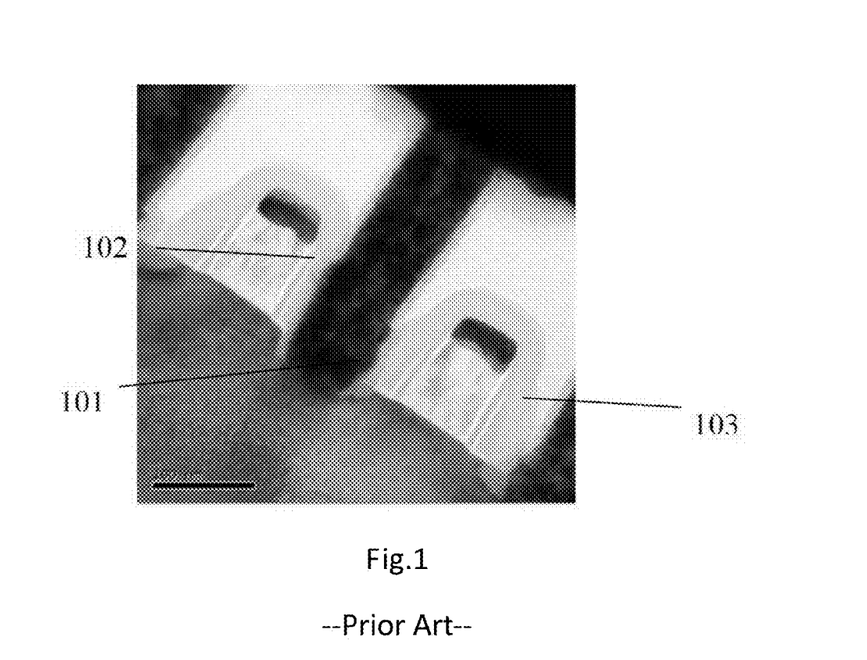
FIG. 1 is a schematic diagram of a conventional 6T SRAM structure through Transmission Electron Microscopy.

As shown in FIG. 1, which illustrates a schematic of a 6T SRAM structure through Transmission Electron Microscopy (TEM), the contact hole 101 formed between the poly silicon gate 102, 103 offsets and makes the spacer of the gate 102 thinner, such alignment shift may cause the failure of the whole SRAM structure.

Figure 2:
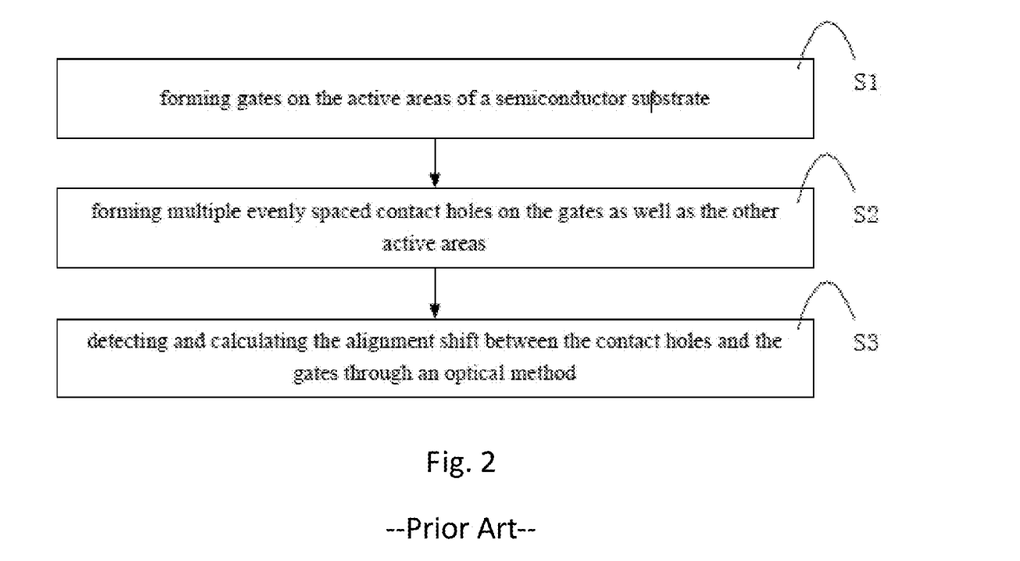
FIG. 2 is a flow chart of a conventional method of detecting the alignment shift of the contact holes relative to the gate structures.

Therefore, it is of great importance to detect and measure the alignment shift of the contact holes relative to the gate structures in a semiconductor device. Currently, the detection is mainly carried out through optical methods. Referring to FIG. 2, which is a flow chart of a conventional method of detecting the alignment shift of the contact holes relative to the gate structures, the method comprises:

Step S1, forming gates on the active areas of a semiconductor substrate;

Step S2, forming multiple evenly spaced contact holes on the gates as well as the other active areas;

Step S3, detecting and calculating the alignment shift between the contact holes and the gates through an optical method; wherein the gate length is determined according to the diameter of the contact hole, the spacing between the adjacent contact holes, and the gate width.

However, with the continuous shrinking of the device dimension, the alignment shifts may not be accurate detected through optical detecting methods due to the resolution limitation thereof, and thus the requirements of precise process control may not be satisfied. Consequently, it is necessary to provide a new method of detecting and measuring the alignment shift of the contact holes relative to the gate structures in a semiconductor device.

SUMMARY OF THE INVENTION

Accordingly, at least one object of the present invention is to provide an accurate detection and measurement of the alignment shifts between the contact holes and the gate structures.

To achieve these and other advantages and in accordance with the object of the invention, as embodied and broadly described herein, the invention provides a method of detecting and measuring the alignment shift of the contacts relative to the gate structures comprising:

Step S01, designing a test model array having different test model regions on the substrate, each of the test model region is designed to form a simulated semiconductor device having multiple first conductivity type transistors of a predetermined critical dimension; the critical dimensions of the transistors differ in different test model regions;

Step S02, forming second conductivity type doped well regions, gate structures of the first conductivity type transistors, and first conductivity type doped active regions in each of the test model regions;

Step S03, forming contacts in each of the test model region;

Step S04, scanning the test model array by an electron-beam inspector to obtain light-dark patterns of the contacts;

Step S05, detecting and measuring the alignment shift of the contacts relative to the gate structures according to the light-dark patterns of the contacts and the critical dimensions of the transistors in the test model regions.

Preferably, the layout of the test model region includes well regions separated from each other by isolation regions in which a plurality of active regions and a plurality of gate lines traversing the active regions are formed, wherein the step S02 further comprises:

Step S11: forming a first mask layer on the substrate, and exposing the well regions;

Step S12: implanting second conductivity type impurities on the substrate and removing the first mask layer to form the second conductivity type doped well regions;

Step S13: forming gate structures of the first conductivity type transistors on the gate lines;

Step S14: forming a second mask layer, and exposing the active regions;

Step S15: implanting first conductivity type impurities on the substrate and removing the second mask layer to form the first conductivity type doped active regions in the second conductivity type doped well regions.

Preferably, the active regions extend in the vertical direction and the gate lines extend in the horizontal direction.

Preferably, the critical dimension of the transistors comprises the space between the adjacent gate structures and the dimension of the contacts.

Preferably, the spaces between the adjacent gate structures of the transistors in the test model regions increase along the horizontal direction of the test model array and equal along the vertical direction; the dimensions of the contacts increase along the vertical direction and equal along the horizontal direction.

Preferably, the test model regions are arranged evenly spaced in the test model array.

Preferably, the contacts comprise contacts formed on the first conductivity type doped active regions between two adjacent gate structures, contacts formed on the gate structures, and shared contacts reaching both the gate structures as well as the first conductivity type doped active regions.

Preferably, the contacts are formed by the following steps: depositing a layer of interlayer dielectric; forming contact holes through lithography and etching process: depositing metals in the contact holes; and performing CMP to remove the metals on the surface of the interlayer dielectric.

Preferably, the landing voltage applied by the electron-beam inspector is 500 eV to 1200 eV; the current applied by the electron-beam inspector is 80 nA to 120 nA.

Preferably, the pixel size of the light-dark patterns scanned by the electron-beam inspector is 30 nm to 100 nm.

Preferably, when the transistors are NMOS transistors, the electron-beam inspector is applied in a positive mode; when the transistors are PMOS transistors, the electron-beam inspector is applied in a negative mode.

The present invention provides a quick and accurate detection and measurement of the alignment shift of the contacts relative to the gate structures by designing different test model regions in which NMOS (or PMOS) transistors of different critical dimensions having contacts and gate structures are formed, scanning the test model regions through e-beam inspectors in a corresponding positive (or negative) mode to obtain light-dark patterns of the contacts, and detecting and measuring the alignment shift according to the transistor critical dimensions and the light-dark patterns. The present invention not only detects the misalignment of the contacts relative to the gate structures conveniently, but also provides reference to the online monitoring of the semiconductor device manufacturing process and ensures the yield enhancement.

BRIEF DESCRIPTION OF THE DRAWINGS

The accompanying drawings are included to provide a further understanding of the advantages and principles of the invention, in which.

DETAILED DESCRIPTION OF THE EMBODIMENTS

Reference will now be made in detail to the present preferred embodiments and the accompanying FIGS. 3-13 of the invention in order to provide a further understanding of the invention. The figures are not drawn to scale and they are provided merely to illustrate the invention instead of limiting the scope of the present invention, like reference numerals are used throughout the figures to designate similar or equivalent element. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention.

Figure 3:
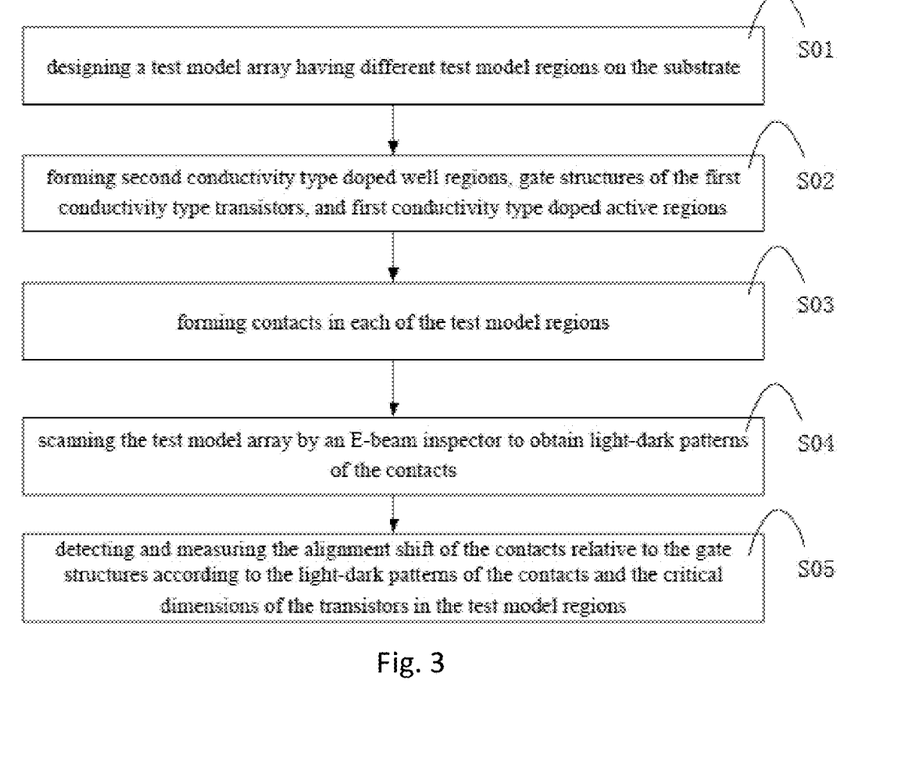
FIG. 3 is a flow chart of the method of detecting the alignment shift of the contacts relative to the gate structures in an embodiment of the present invention.

Referring to FIG. 3, the method of detecting and measuring the alignment shift of the contacts relative to the gate structures in a semiconductor device comprises the following steps:

Step S01, designing a test model array having different test model regions on the substrate, wherein each of the test model region is designed to form a simulated semiconductor device having first conductivity type transistors with a predetermined critical dimension; the critical dimensions of the transistors keep consistent in a same test model region while differ in different test model regions.

Figure 4:
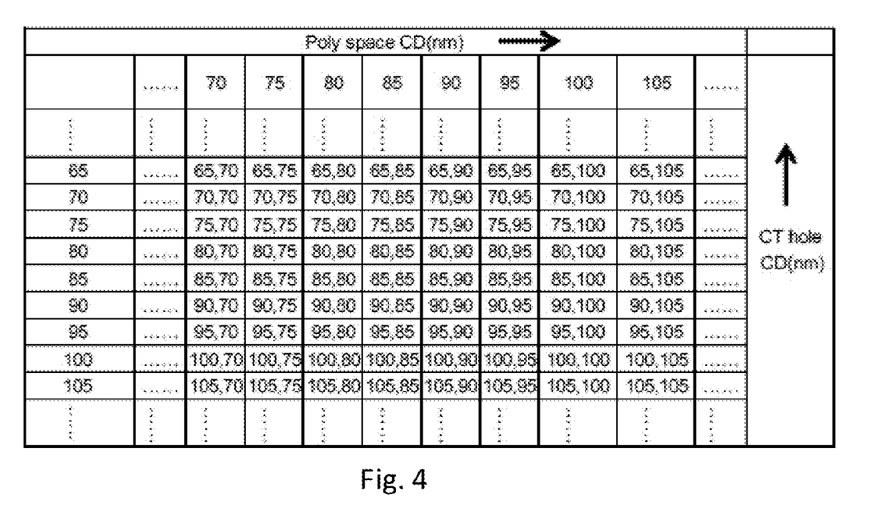
FIG. 4 is a schematic diagram of the critical dimensions of the transistors formed in different test model regions.

To be specific, the critical dimension of the transistors in each test model region comprises the space between the adjacent gate structures and the dimension of the contacts. The test model array is designed that the spaces between the adjacent gate structures in the test model regions increase along the horizontal direction of the test model array and equal along the vertical direction, and the contact dimensions increase along the vertical direction and equal along the horizontal direction, as shown in FIG. 4. The size of the test model region can be designed according to the actual requirements, such as a square region covering a 2 mm×2 mm area. In addition, the test model regions can be arranged evenly spaced and the test model array can be an array having N×N test model regions in which transistors of different critical dimensions are formed, such as a 3×3 array.

Step S02, forming second conductivity type doped well regions, gate structures, and first conductivity type doped active regions in the test model regions, which comprises the steps of performing an ion implantation process to form second conductivity type doped well regions in the substrate; forming gate structures of the first conductivity type transistors; and performing an ion implantation process to form first conductivity type doped active regions in the second conductivity type doped well regions.

Figure 5:
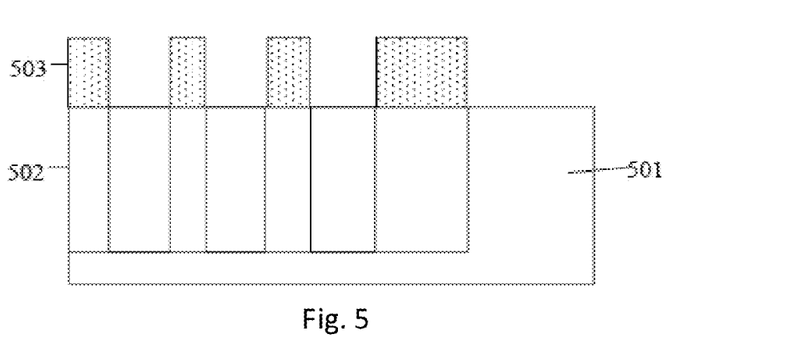
FIG. 5-9 are cross sectional diagrams showing the manufacturing processes of the gate structures and the contacts in a test model region.

Usually a semiconductor device comprises both P-type transistors and N-type transistors, it is noted that in the present invention, the simulated semiconductor device formed in the test model region comprises only one conductivity type transistors. More specifically, in the embodiment, the semiconductor to be simulated is a static memory cell including a plurality of pull-up transistors, pull-down transistors and pass transistors. That is to say, in the test model regions, the pull-up transistors, pull-down transistors and pass transistors are all of a same conductivity type in the simulated SRAM semiconductor device. Further, the layout of each test model region includes well regions separated from each other by isolation regions in the substrate in which a plurality of active regions and a plurality of gate lines traversing the active regions are formed. The active regions extend in the vertical direction and the gate lines extend in the horizontal direction. The manufacturing process of the simulated semiconductor devices having first conductivity type transistors further comprises the following steps:

Step S11: forming a first mask layer 503 on the substrate 501, and exposing the well regions in the test model regions 502, as shown in FIG. 5; wherein, the remained first mask layer convers the shallow isolation trenches which have been formed in the isolation regions before.

Figure 6:
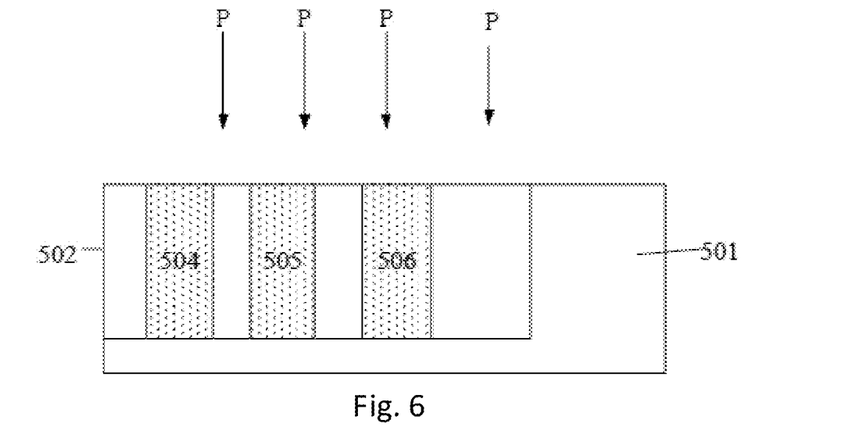

Step S12: implanting second conductivity type impurities on the substrate 501 and removing the first mask layer 503 to form the second conductivity type doped well regions;

In the embodiment, the first conductivity type is N-type and the second conductivity type is P-type. Referring to FIG. 6, the P-type doped well regions 504, 505 and 506 are formed by implanting the P-type impurities on the substrate.

Figure 7:
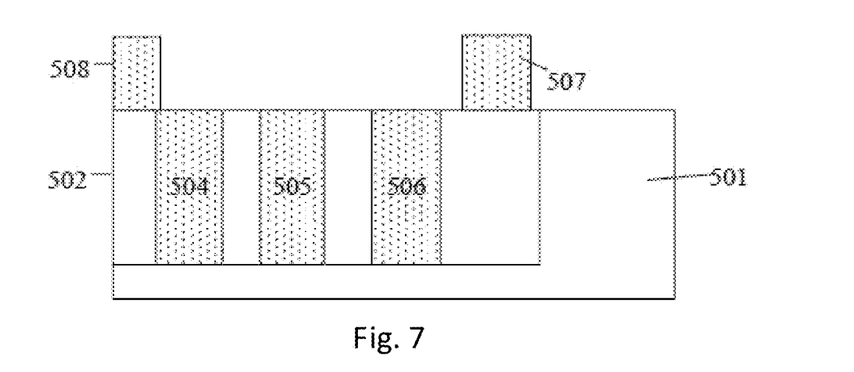

Step S13: forming gate structures of the first conductivity type transistors on the gate lines, as shown in FIG. 7.

Preferably, the gate structures are formed by the following steps comprising forming a gate oxide layer on the substrate; forming a polysilicon layer on the gate oxide layer; and etching to form the gate structure according to a gate mask. The formation of the gate structures is not described in detail, and it is understood those skilled in the art appreciate that other suitable processing steps may be made in accordance with the present invention.

Figure 8:
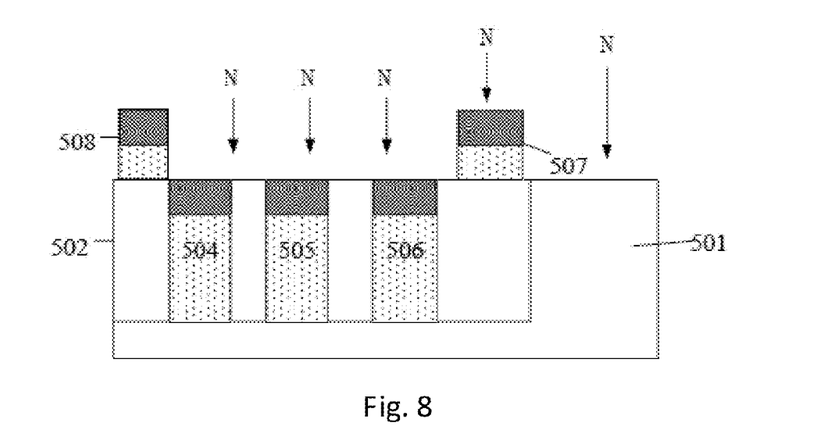

Step S14: forming a second mask layer, and exposing the active regions;

Step S15: implanting first conductivity type impurities on the substrate and removing the second mask layer to form the first conductivity type doped active regions in the second conductivity type doped well regions. As shown in FIG. 8, N-type impurities are implanted in the regions 504, 505 and 506 to form the N-type active regions of the N-type transistors. It is noted that in other embodiments, the transistors can be P-type transistor, thus N-type impurities are implanted in the substrate to form N-type doped well regions and P-type impurities are implanted to form P-type active regions in the well regions.

Figure 9:
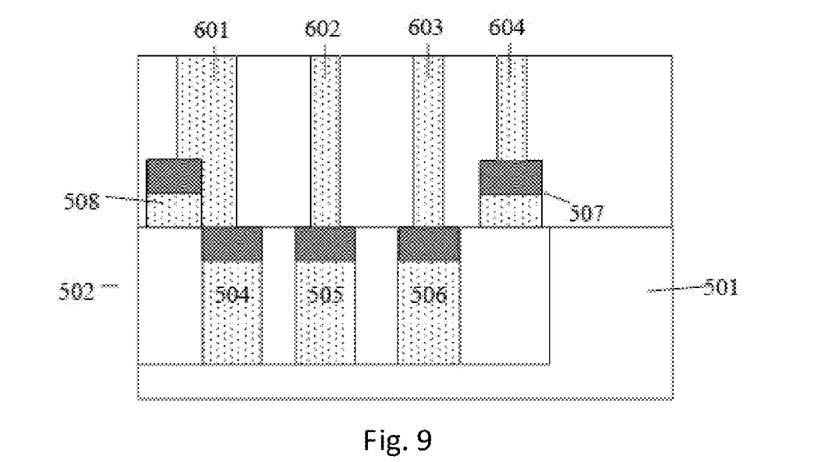

Step S03, forming contacts in each of the test model region, as shown in FIG. 9. To be specific, the step S03 further comprises: depositing a layer of interlayer dielectric; forming contact holes in the interlayer dielectric through lithography and etching process; depositing metals in the contact holes; and performing CMP to remove the metals on the surface of the interlayer dielectric. The contact formation process, which is a well-known operation, is not shown in detail, and is not limited to the steps mentioned above.

As shown in FIG. 9, the contacts can be formed in the active regions 505, 506 between two adjacent gate structures 507, 508, such as the contacts 602, 603; or formed on the gate structure 507, such as the contact 604; or formed reaching both the gate structure 508 and the active region 504, such as the shared contact 601.

Step S04, scanning the test model array by an E-beam (electron-beam) inspector to obtain light-dark patterns of the contacts.

Normally, in the light-dark patterns, the contacts formed above the N-type active regions are dark when the E-beam is applied in a positive mode, while light when the E-beam is applied in a negative mode; on the contrary, the contacts formed above the P-type active regions are light when the E-beam is applied in a positive mode, while dark when the E-beam is applied in a negative mode. However, if the contacts formed above the N-type active regions offset relative to the gate structures and connect the adjacent gate structures, current leakages exist and the contacts become light/dark when the E-beam is applied in a corresponding positive/negative mode. In the present invention, since the transistors of the simulated semiconductor devices are of a same conductivity type, the electricity leakages can be detected clearly and quickly by applying the E-beam only in one mode (such as in the positive mode) without mistaking the normal light contacts formed above the P-type active regions with the leaky contacts formed above the N-type active regions. In the embodiment, the transistors of the simulated semiconductor devices are N-type transistors, the electron-beam inspector is applied in a positive mode. In other embodiments, when the transistors are P-type transistors, the electron-beam inspector is applied in a negative mode. As a preferred embodiment in accordance with the present invention, the landing voltage applied by the electron-beam inspector is 500 eV to 1200 eV; the current applied by the electron-beam inspector is 80 nA to 120 nA, and the pixel size of the light-dark patterns scanned by the electron-beam inspector is 30 nm to 100 nm.

Step S05, detecting and measuring the alignment shift of the contacts relative to the gate structures according to the light-dark patterns of the contacts and the critical dimension of the transistors in the test model regions.

Figure 10:
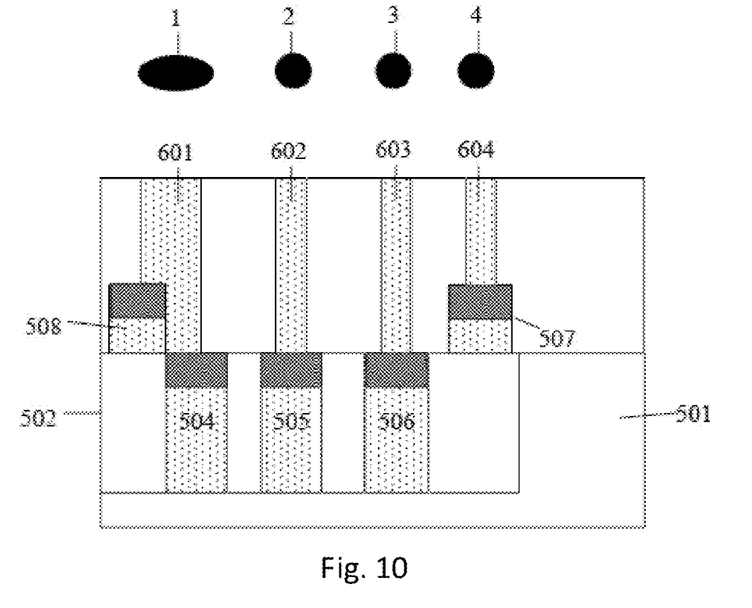
FIG. 10 is a schematic diagram showing part of a test model region with no current leakages scanned by the electron-beam inspector.
Figure 11:
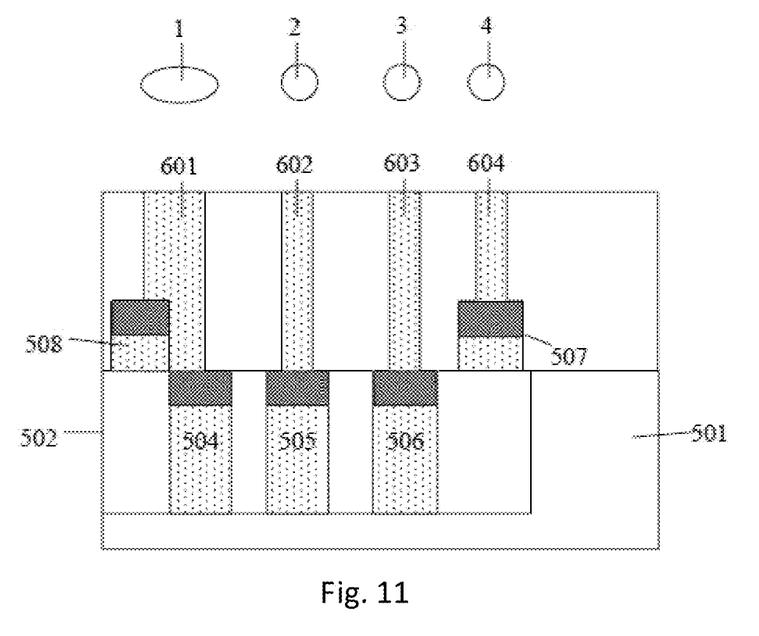
FIG. 11 is a schematic diagram showing part of a test model region with current leakages scanned by the electron-beam inspector.

The step S05 will be explained in further details by reference to FIGS. 10 to 13. It is noted that in the embodiment, the alignment shift of the contacts relative to the gate structures refers to the offsets of the contacts which are formed above the active regions between two adjacent gate structures. As shown in FIG. 10 and FIG. 11, in the embodiment, the E-beam is applied in a positive mode, since the active regions and the gate structures are both implanted by N-type impurities, the lights spots 1, 2, 3 and 4 corresponding to the contacts 601, 602, 603 and 604 are all dark in the light-dark patterns when no current leakage exists, while light when current leakage exists.

Figure 12:
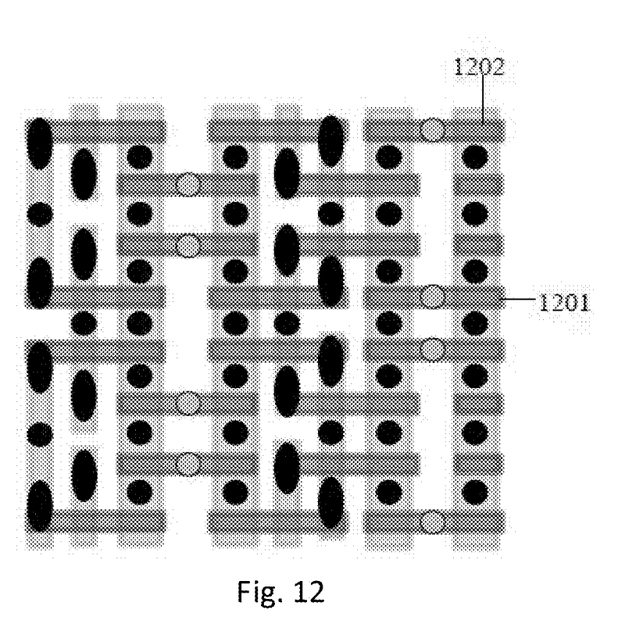
FIG. 12 is a schematic diagram of the light-dark pattern when the contacts are aligned with the gate structures.

Referring to FIG. 12, the E-beam is applied in a positive mode and the contacts are aligned with the gate structures, thus the shared contacts reaching the gate structures 1201 and the active regions 1202, the contacts in the active regions 1202 between the gate structures and the contacts on the gate structures 1201 are dark in the light-dark pattern. Since the shift of the contacts on the gate structures 1201 hardly results in the current leakage, it will not be further described in the present invention.

Figure 13:
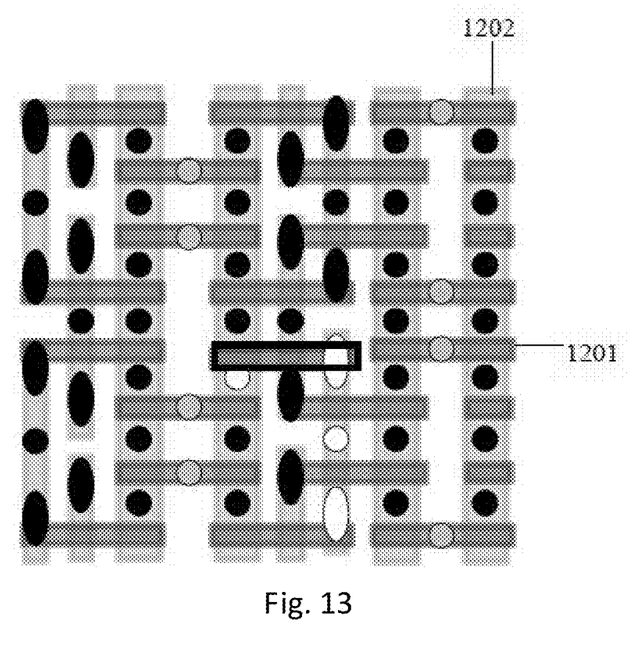
FIG. 13 is a schematic diagram of the light-dark pattern when a contact is misaligned with the gate structure.

As shown in FIG. 13, the circular contact adjacent to one end of the gate structure having bold edge offsets to connect therewith and shorts the gate structure to the substrate, thereby causing charge transfer and current leakage. The contact is also connected to the long elliptic contact which is formed above the bold edge gate structure and is further connected to other two contacts through the active region. Thus, the light spots of the four contacts all become light in the dark-light pattern. It is noted that in FIG. 13, only one offsetting contact is illustrated, while in the practical applications, the misalignments of the contacts relative to the gate structures occur in the whole test model region, and the light spots brightness of all the contacts formed between adjacent gate structures will change oppositely, so that the misalignment can be detected immediately.

On the other hand, since the alignment shifts are equal in all the test model regions of the test model array, the light-dark patterns of different test model regions will differ due to the different transistor critical dimensions, and in a certain test model region in which the contact alignment shift exceeds the misalignment tolerance, the light spots brightness of the offsetting contacts will reverse, thus the value of the misalignment can also be measured according to the critical dimension utilized in the certain test model region. To be specific, in the embodiment, the test model array is designed that the spaces between the adjacent gate structures in the test model regions increase along the horizontal direction of the test model array and equal along the vertical direction, the contact dimensions increase along the vertical direction and equal along the horizontal direction, if a test model region M+1 has the same normal dark contact light spots with the following test model regions M+2, M+3, . . . in the horizontal direction according to the light-dark patterns, while the adjacent test model region M has light contact light spots, it can be determined that the alignment shift ΔL is in the range of $(L_m-D_m)/2-A \leq \Delta L \leq (L_{m+1}-D_m)/2-A$, wherein $L_m$ and $L_{m+1}$ represent the spaces between the adjacent gate structures in the test model regions M, M+1 respectively, Dm represents the contact diameter in the test model regions M and M+1, "A" represents the minimum distance between the contact and the gate structure which can be determined by the processing window. In other embodiments, the alignment shift can also be measured by comparing the critical dimensions of two adjacent test model regions in the vertical direction whose light-dark patterns change, or by other conventional calculation methods.

In summary, according to the method of detecting and measuring the alignment shift of the contacts relative to the gate structures in a semiconductor device of the present invention, different test model regions are designed in which NMOS (or PMOS) transistors of different critical dimensions having contacts and gate structures are formed, and then the test model regions are scanned through e-beam inspectors in a corresponding positive (or negative) mode to obtain light-dark patterns of the contacts, and the alignment shift can be detected and measured according to the transistor critical dimensions and the light-dark patterns. The present invention not only detects the misalignment of the contacts relative to the gate structures conveniently, but also provides reference to the online monitoring of the semiconductor device manufacturing process and ensures the yield enhancement.

The invention claimed is:

1. A method of detecting and measuring the alignment shift of contacts relative to the gate structures comprising:
   Step S01, designing a test model array having different test model regions on the substrate, each of the test model region is designed to form a simulated semiconductor device having multiple first conductivity type transistors of a predetermined critical dimension; the critical dimensions of the transistors differ in different test model regions;
   Step S02, foaming second conductivity type doped well regions, gate structures of the first conductivity type transistors, and first conductivity type doped active regions in each of the test model regions;
   Step S03, forming contacts in each of the test model region;
   Step S04, scanning the test model array by an electron-beam inspector to obtain light-dark patterns of the contacts;
   Step S05, detecting and measuring the alignment shift of the contacts relative to the gate structures according to the light-dark patterns of the contacts and the critical dimension of the transistors in the test model regions.

2. The method of detecting and measuring the alignment shift of contacts relative to the gate structures according to claim 1, wherein the test model regions are arranged evenly spaced in the test model array.

3. The method of detecting and measuring the alignment shift of contacts relative to the gate structures according to claim 1, wherein the contacts comprise contacts formed on the first conductivity type doped active regions between two adjacent gate structures, contacts formed on the gate structures, and shared contacts reaching both the gate structures as well as the first conductivity type doped active regions.

4. The method of detecting and measuring the alignment shift of contacts relative to the gate structures according to claim 1, wherein the contacts are formed by the following steps: depositing a layer of interlayer dielectric; forming contact holes through lithography and etching process; depositing metals in the contact holes; and performing CMP to remove the metals on the surface of the interlayer dielectric.

5. The method of detecting and measuring the alignment shift of contacts relative to the gate structures according to claim 1, wherein the landing voltage applied by the electron-beam inspector is 500 eV to 1200 eV; the current applied by the electron-beam inspector is 80 nA to 120 nA.

6. The method of detecting and measuring the alignment shift of contacts relative to the gate structures according to claim 1, wherein the pixel size of the light-dark patterns scanned by the electron-beam inspector is 30 nm to 100 nm.

7. The method of detecting and measuring the alignment shift of contact relative to the gate structures according to claim 1, wherein when the transistors are NMOS transistors, the electron-beam inspector is applied in a positive mode; when the transistors are PMOS transistors, the electron-beam inspector is applied in a negative mode.

8. The method of detecting and measuring the alignment shift of contacts relative to the gate structures s according to claim 1, wherein the layout of the test model region includes well regions separated from each other by isolation regions in which a plurality of active regions and a plurality of gate lines traversing the active regions are formed, wherein the step S02 further comprises:
   Step S11: forming a first mask layer on the substrate, and exposing the well regions;
   Step S12: implanting second conductivity type impurities on the substrate and removing the first mask layer to form the second conductivity type doped well regions;
   Step S13: forming gate structures of the first conductivity type transistors on the gate lines;
   Step S14: forming a second mask layer, and exposing the active regions;
   Step S15: implanting first conductivity type impurities on the substrate and removing the second mask layer to form the first conductivity type doped active regions in the second conductivity type doped well region.

9. The method of detecting and measuring the alignment shift of contacts relative to the gate structures according to claim 8, wherein the active regions extend in the vertical direction and the gate lines extend in the horizontal direction.

10. The method of detecting and measuring the alignment shift of contacts relative to the gate structures according to claim 1, wherein the critical dimension of the transistors comprises the space between the adjacent gate structures and the dimension of the contacts.

11. The method of detecting and measuring the alignment shift of contacts relative to the gate structures according to claim 10, wherein the spaces between the adjacent gate structures of the transistors in the test model regions increase along the horizontal direction of the test model array and equal along the vertical direction; the dimensions of the contacts increase along the vertical direction and equal along the horizontal direction.

* * * * *